United States Patent [19]
Glover

[11] Patent Number: 5,144,568
[45] Date of Patent: Sep. 1, 1992

[54] FAST MEDIAN FILTER

[75] Inventor: J. Howard Glover, Kirkland, Wash.

[73] Assignee: Sundstrand Corporation, Rockford, Ill.

[21] Appl. No.: 403,912

[22] Filed: Sep. 1, 1989

Related U.S. Application Data

[63] Continuation of Ser. No. 53,873, May 26, 1987, abandoned.

[51] Int. Cl.$^5$ ............ G06F 7/38; G06F 15/31
[52] U.S. Cl. ............ 364/715.01; 364/724.01
[58] Field of Search ............ 364/715.01, 724.01, 364/734; 382/30

[56] References Cited

U.S. PATENT DOCUMENTS

| | | | |
|---|---|---|---|
| 4,135,248 | 1/1979 | Bluzar | 364/715.01 |
| 4,334,223 | 6/1982 | Katagi | 364/734 |
| 4,513,440 | 4/1985 | Delman | 364/715 |
| 4,713,786 | 12/1987 | Roskind | 364/715.01 |

FOREIGN PATENT DOCUMENTS 58-222341  12/1983  Japan .................. 364/734

OTHER PUBLICATIONS

Wolfe et al "Fast Median Filter Implementation" SPIE vol. 207 *Applications of Digital Image Processing* III (1979) pp. 154–160.

Chen et al "Pipelined Median Generation" *IBM Tech. Disclosure Bulletin* vol. 25 No. 6 Nov. 1982 pp. 2887–2889.

Oflazer, "Design and Implementation of a Single-Chip 1-D Median Filter" *IEEE Trans. on Acoustics, Speech, and Signal Processing* vol. AAP-31, No. 5, Oct. 1983, pp. 1164–1168.

*Primary Examiner*—David H. Malzahn
*Attorney, Agent, or Firm*—Mason, Kolehmainen, Rathburn & Wyss

[57] ABSTRACT

A fast median filter is disclosed for filtering high frequency noise from signals, such as, signals from a radio altimeter. The filter continuously provides the median of a predetermined number of points of the signal, which are received in an array, by successively comparing each data point in the array with each other data point in the array. A counter is either incremented or decremented depending on the result of each comparison. If the counter reaches a predetermined value at the end of the sequence of comparisons, the median is determined. A pointer keeps track of the oldest data point in the array. After the median is determined, a new data point is received into the array and written over the oldest data point. The median of the array is determined each time the array is updated with a new data point. When the pointer reaches the last position in the array, the pointer is reset to the first position and is subsequently increment in the same manner.

5 Claims, 3 Drawing Sheets

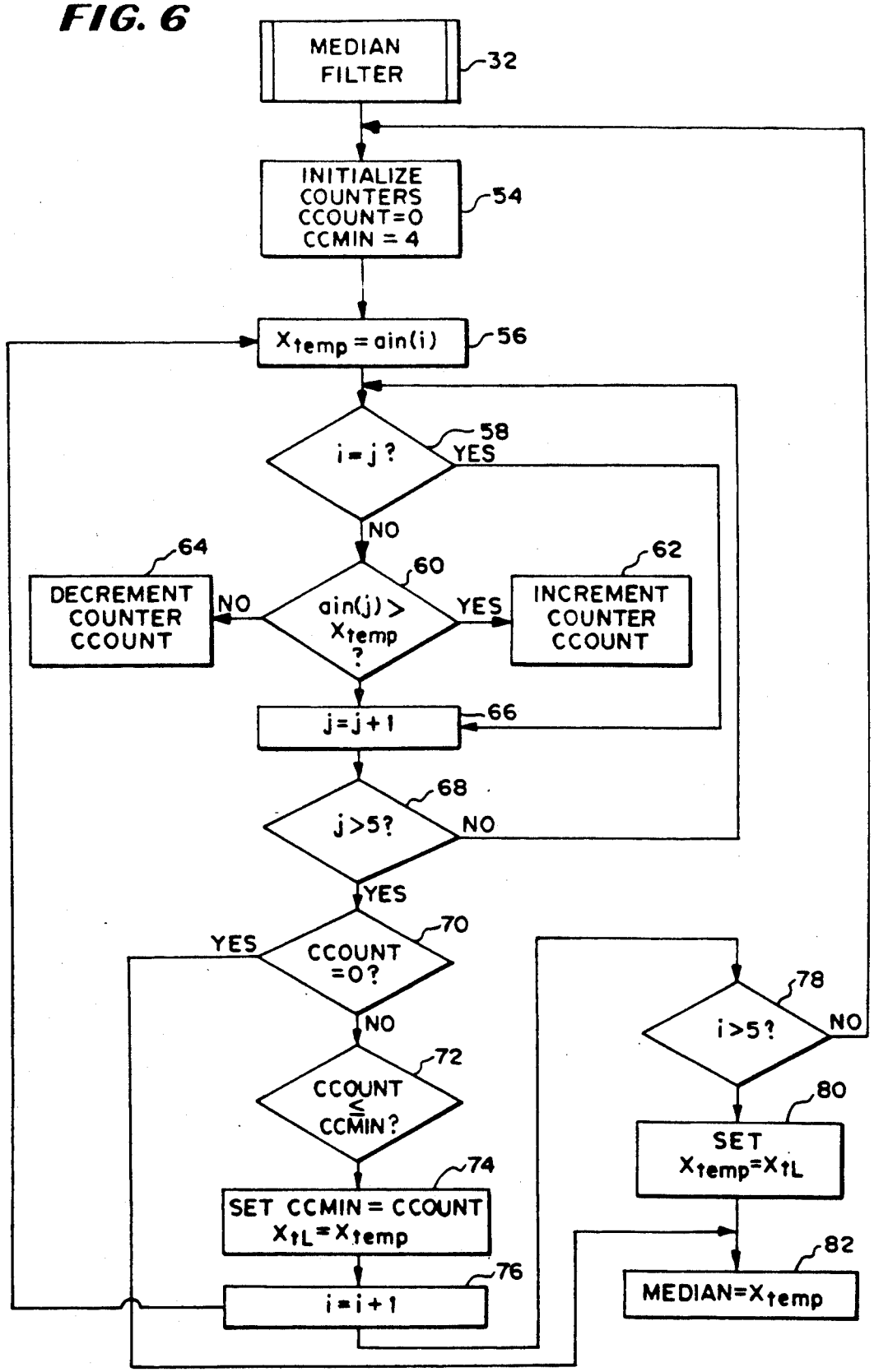

FAST MEDIAN FILTER

This application is a continuation of application Ser. No. 07/053,873, filed May 26, 1987, now abandoned.

BACKGROUND OF THE INVENTION

1. Field of the Invention

This invention relates generally to a filter for filtering high frequency noise from a signal, such as, a radio altimeter signal and, more particularly, to a fast median filter for filtering high frequency noise from a signal while preserving sharp edges in the signal by sorting a finite set of data points of the signal to determine the median of the set of data points without shifting or moving the data points in memory.

2. Description of the Prior Art

Radio altimeters are instruments that provide an indication of the distance of an aircraft above the terrain. These devices measure the time it takes for a radio signal at about 4300 mHz to travel from the aircraft to and from the terrain being overflown. If the terrain was a perfectly flat horizontal plane, mirror-like reflection of the radio signal would result. In this situation, the distance of the aircraft above the terrain could be measured exactly. However, the terrain is not perfectly flat, which results in scattering of the radio signal, consequently causing high frequency noise components in the radio altitude signal.

There have been various attempts in the art, both analog and digital, to provide a suitable filter for filtering high frequency noise from a radio altimeter signal. An example of an analog filter is disclosed in U.S. Pat. No. 3,715,718 to Astengo, which is assigned to the same assignee as the assignee of the present invention. In Astengo, a radio altitude rate signal and a barometric altitude rate signal are applied to a complementary filter, comprised of a high pass filter and a low pass filter. The radio altitude rate signal is applied to the low pass filter for removing high frequency noise components, while the barometric altitude rate signal is applied to the high pass filter. The outputs of the filters are combined to provide a composite signal. The complementary filter, disclosed in Astengo, overcomes earlier encountered problems which attempted to remove high frequency noise components from radio altitude or radio altitude rate signals with analog filters. In those systems, low pass filters alone were used with sufficiently high time constants to remove high frequency noise. However, such filters provided an unsuitable response time to actual changes in the radio altitude. Although this problem is overcome in Astengo through the use of composite signal, such a system, among other things, also requires the use of a barometric altitude rate signal.

There are also various digital techniques for filtering noisy signals, such as, radio altitude or radio altitude rate signals, both linear and non-linear. One technique is known as a mean filter. Mean filters are linear filters which provide the linear average of a signal applied to its input. While mean filters may be suitable in some applications, they provide unsatisfactory results for signals which have sharp edges. A radio altimeter will generate a signal with a sharp edge when the aircraft is flying over a steep cliff, ravine or the like. In such a situation, a mean filter will smooth out the signal edges as well as the noise. Consequently, mean filters provide unsatisfactory results when used with signals having sharp edges.

Another type of filter used in such applications is a median filter. Such filters and related filters are generally described in an article entitled, "Generalized Median Filtering and Related Non-Linear Filtering Techniques", published in *IEEE Translations on Acoustics, Speech and Signal Processing*, Vol. ASSP-33, No. 3, June 1985.

Median filters are non-linear filters, which determine the median signal value for a finite neighborhood around each data point. For example, for the following sequential data points: 22, 16, 19, 18, 17; the median is 18, while the linear mean is 18.4. The mean is obtained by adding all the data points and dividing the resulting sum by the total number of data points.

Median filters are well adapted to filtering impulsive and high frequency noise from signals, while preserving sharp signal edges. Median filters generally operate on a running array of, for example, 5 data points at a time. At each sample time, the group of 5 data points is sorted and the median determined. Some conventional median filters, sometimes call "bubblers", determine the median of an array by comparing each data point in succession with the data point immediately next to it and shifting the data point depending on the result of the comparison. Such conventional median filters involve a substantial amount of manipulation of the data in memory. Specifically, a substantial number of memory access and move operations are required. Consequently, such operations result in a substantial amount of processing time and therefore are not suitable for filtering data at high input rates, such as the data from a radio altimeter.

SUMMARY OF THE INVENTION

It is thus an object of the present invention to overcome the problems of conventional filters for filtering signals at high input data rates, such as radio altitude signals.

It is another object of the present invention to provide a filter which can reduce high frequency noise.

It is another object of the invention to provide a filter which can preserve sharp signal edges.

Briefly, the present invention relates to a median filter for filtering high frequency noise from a signal with a relatively high input data rate, such as, a radio altitude signal. The median filter operates on an array of a fixed number of data points. A pointer is used to keep track of the oldest data point in the array. Each time the median is determined a new data point is applied to the array and written over the oldest data point. The median is determined each time the array is updated with a new data point. The pointer is incremented each time the array is updated to keep track of the oldest data point in the array. When the pointer is pointing to the last data point in the array, the pointer is reset to point at the first data point in the array. Each data point in the array is compared with each of the other data points in the array. An index is incremented or decremented as a result of the comparison. When the index attains a value of zero, the median is located and the process is terminated. In cases of repeat data values in the array, the index may not go to zero. In this case, the minimum value of the index will correspond to the median. The median filter according to the present invention requires neither shifting of data points when a new sample is introduced nor sorting of the array to find the median. The advantage of eliminating these steps is that the data is not required to be moved in memory. As such, the processing time is significantly reduced, thus allowing the filter to process data at a relatively high input rate, such as, radio altimeter signal data, in real time.

BRIEF DESCRIPTION OF THE DRAWING

The above and other objects and advantages of the present invention will become apparent from the following detailed description of the preferred embodiment of the present invention illustrated in the accompanying drawing, wherein:

FIG. 6 is a flow chart of the median filter in accordance with the present invention.

DETAILED DESCRIPTION OF THE INVENTION

While the median filter in accordance with the present invention will hereinafter be described in detail as a filter for suppressing high frequency noise in a radio altitude signal while preserving sharp signal edges, it is to be understood that the principles of the invention are not limited to such use. The principles of the invention are equally applicable to be used with any input signal wherein it is required to filter out high frequency noise while preserving signal edges.

Figure 1:
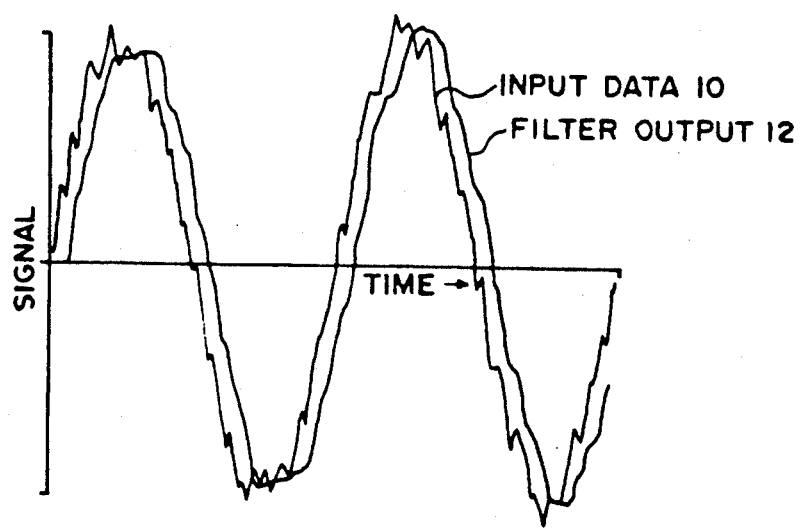
FIG. 1 is a plot of an input signal comprising a sine wave with high frequency noise components and the corresponding output signal from a filter in accordance with the present invention superimposed on the plot.

Referring to the drawing and in particular FIG. 1, a typical input signal, for example, from a radio altimeter, is illustrated and identified by the reference numeral 10. The input signal 10 comprises a sine wave, which may result when an aircraft is flying over undulating terrain. The high frequency noise is represented by the small spikes appearing all along the curve. The spikes are due, in part, to ground scattering of the radio signal due to the fact that the terrain is not perfectly flat, which results in non-specular reflection of the radio waves back to the radar altimeter. The signal, identified by the reference numeral 12, superimposed on FIG. 1, represents the output signal from a median filter in accordance with the present invention, which receives an input signal similar to the input signal 10. As will be noted, the spikes or high frequency noise components are fairly well smoothed out, thus improving the signal-to-noise ratio.

Figure 2:
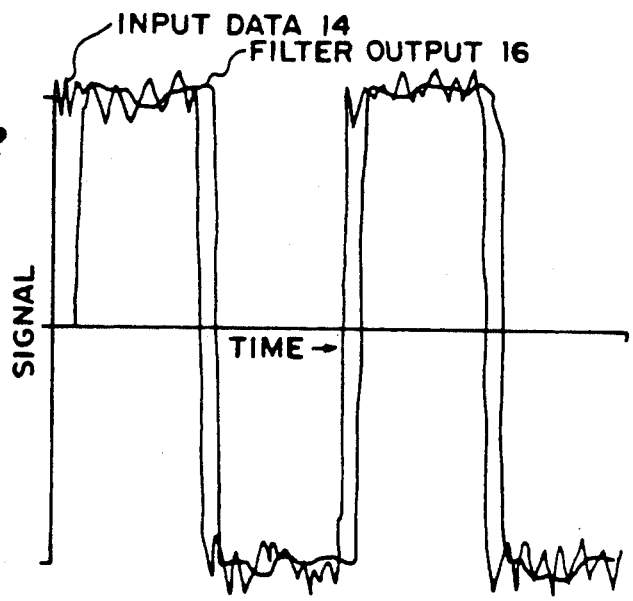
FIG. 2 is a plot of an input signal comprising a square wave with high frequency components and the corresponding output signal from a filter in accordance with the present invention superimposed on the plot.

FIG. 2 represents another typical input signal comprising a square wave, for example, from a radio altimeter, and identified by the reference numeral 14. Similar to the signal 10 in FIG. 1, the square wave input signal also contains high frequency noise represented by the spikes along the curve 14. The square wave signal is shown to illustrate an important aspect of the invention; namely, the ability of the median filter to preserve sharp signal edges. An input signal, such as signal 14, may represent that an aircraft is flying over a ravine or a steep cliff. Some conventional filters, as described in an article entitled, "Generalized Median Filtering and Related Non-Linear Filtering Techniques", *IEEE Transactions on Acoustics, Speech and Signal Processing*, Lee and Kassom, Volume ASSP-33, No. 3, June 1985, smooth out sharp edges, thereby distorting input signals with sharp edges. When a signal, such as, a square wave signal 14, is applied to a median filter in accordance with the present invention, the sharp edges are preserved. Referring back to FIG. 2, the signal identified by the numeral 16 represents the response of a median filter in accordance with the present invention when an input signal, such as, the signal 14 is applied to its input. As illustrated, the high frequency noise is fairly well suppressed, thus improving the signal-to-noise ratio of the signal, while preserving the sharp signal edges.

FIG. 2 also illustrates another important aspect of the median filter in accordance with the present invention. In particular, the horizontal portion of the sine wave 14, represents a monotonic data trend. Monotonic trends are data sequences wherein data points within a finite neighborhood are repeated. Some digital filters are unable to preserve such monotonic trends. The median filter of the present invention not only preserves sharp signal edges while suppressing high frequency noise, it also preserves monotonic trends.

Figure 3:
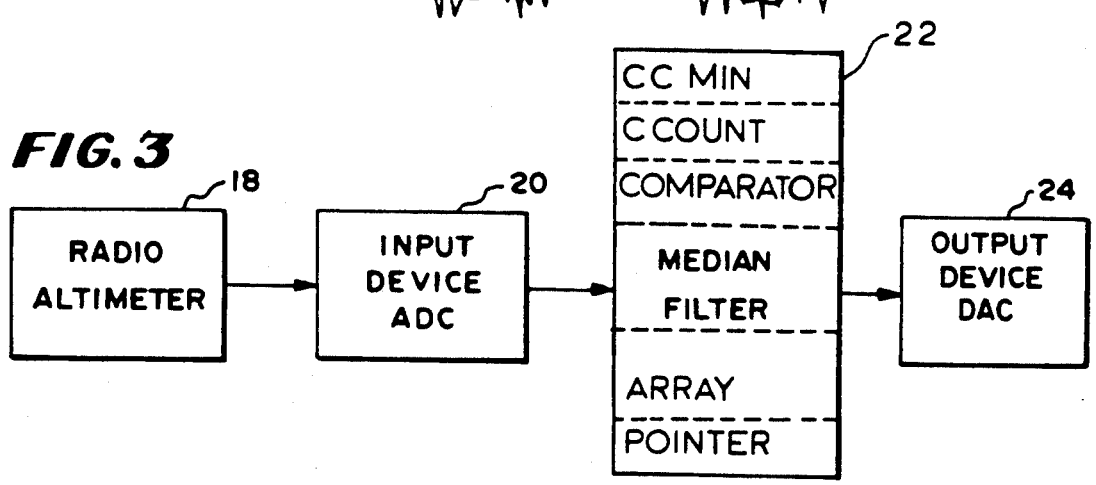
FIG. 3 is a block diagram of a system utilizing the median filter in accordance with the present invention.

Referring to FIG. 3, a representative system incorporating the median filter in accordance with the present invention is illustrated. As heretofore stated, although the median filter according to the present invention is described in conjunction with a signal from a radio altimeter, it will be understood by those of ordinary skill in the art that the principles of the invention are not so limited.

The output signal from a conventional radio altimeter is applied to an input device 20. Typical output signals from the radio altimeter may be as illustrated in FIGS. 1 and 2 and identified by the reference numerals 10 and 14, respectively. The input device 20 is not a part of the present invention. Any input device can be utilized that is adapted to sampling the input signal at a rate of approximately twice the frequency of the input signal. Also shown for convenience with the block, and identified by the reference numeral 20, is an analog-to-digital converter (ADC) Any conventional ADC is suitable that can handle the throughput or data rate of the input signal. The digitized radio altimeter signal is then applied to the median filter 22. The basic principles of the median filter in accordance with the present invention can be implemented with various conventional microprocessors, minicomputers, and the like utilizing the algorithm illustrated in FIG. 4 and described in detail below. The output signal from the median filter 22 is subsequently applied to a conventional output device 24, which may contain a digital-to-analog converter (DAC). Any conventional DAC which is compatible with the data rate of the system is suitable. The output signal of the DAC represents an analog equivalent of the response of the median filter 22, such as the output signals 12 and 14 in FIGS. 1 and 2, respectively. These output signals may then be applied to various warning and control systems which require a radio altitude signal. Examples of systems requiring a radio altitude signal are contained in U.S. Pat. Nos. 3,715,718, 3,925,751; 3,934,221; 3,936,796; 3,946,358; 3,947,808; 3,947,809; 3,947,810; 3,958,218; 3,988,713; 4,030,065; 4,060,793 and 4,215,334.

Figure 4:
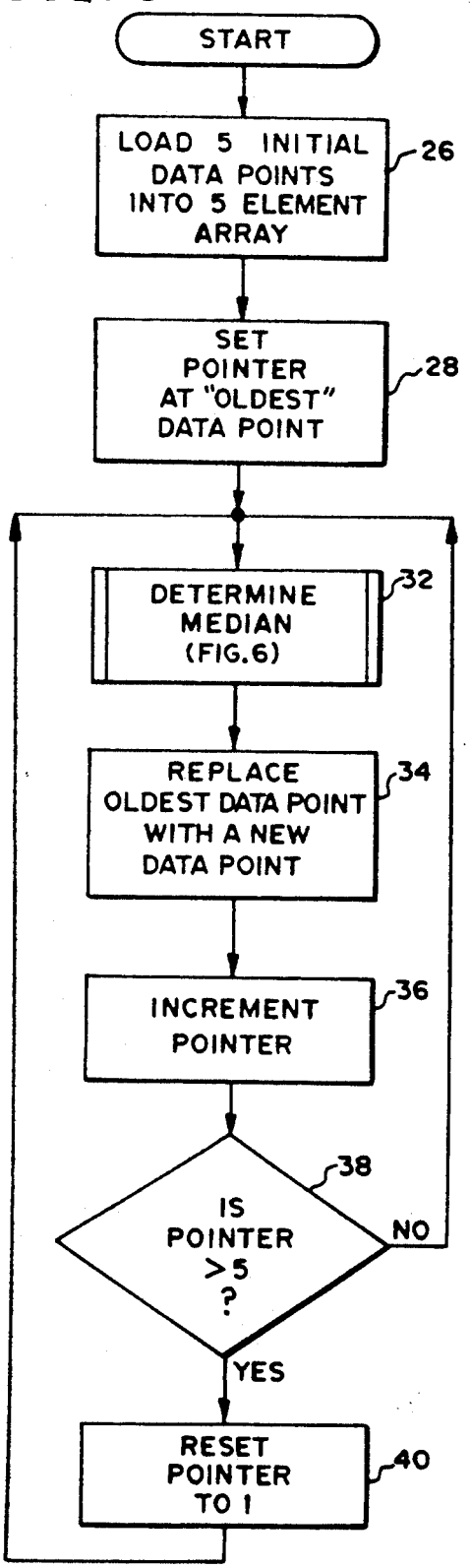
FIG. 4 is a flow chart illustrating an important aspect of the present invention regarding manipulation of the input data.
Figure 5:
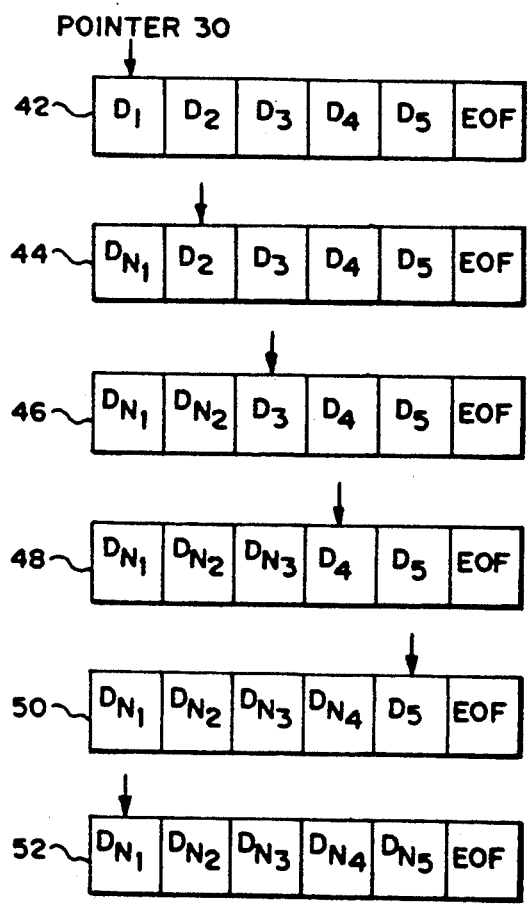
FIG. 5 illustrates six arrays showing how the pointer is incremented as new data points in the array are updated with new data points.

Referring to FIG. 4, a flow chart is provided which illustrates an important aspect of the invention regarding data handling. Generally, the data is loaded into a running array having a fixed number of elements. As illustrated in FIGS. 4, 5 and 6, and as hereinafter described, a five-element array is utilized. However, as will be appreciated by those of ordinary skill in the art, the invention is not so limited. The principles of the invention are applicable to any array having an odd number of elements.

The initial step 26 of the median filter is to load a predetermined number of input data points into an array having an odd number of elements. As illustrated in FIG. 4, a five-element array is used; however, other arrays with an odd number of elements could also be used. In order to provide a better understanding of this aspect of the invention, FIG. 5 is provided and will be referred to in connection with the description of the algorithm in FIG. 4. FIG. 5 illustrates the operation of the pointer 30. An important aspect of the invention is that the pointer 30 always keeps track of the oldest data point in the array. After the data is loaded into the array, the pointer 30 in the step 28 is set to point to the oldest data point in the array. As shown in FIG. 5, the pointer is shown pointing to data point $D_1$ in the array 42, which is the oldest data point of the set of data points $D_1$ through $D_5$, inclusive. After the pointer 30 is set in step 28 to point to the oldest data point in the array, the five data points in the array are then input into the median filter in accordance with the present invention in step 32. In this step 32, the median of the five data points is determined by the median filter in accordance with the present invention and discussed in detail below. After the median of the array is determined, the array is updated in step 34 with a new data point, identified as $D_{N1}$ in FIG. 5, and written over the oldest data point, which is data point $D_1$. After the step 34 is executed, the updated array 44 thus comprises data points $D_{N1}$ and $D_2$ through $D_5$, as illustrated in FIG. 5. In the next step 36, the pointer 30 is incremented to point to the oldest data point in the array. Since the previous oldest data point $D_1$ has been replaced with a new data point $DN_1$, the pointer 30 is thus set to data point $D_2$. The process of updating the data points in the array and keeping track of the oldest data point is continued until the pointer reaches the last element of the array, such as shown in array 50. Each time the pointer is incremented, the system checks in step 38 (FIG. 4) to determine if the pointer is set to the last position in the array. If the pointer 30 is not set at the last position in the array, the process continues as heretofore described. If the pointer 30 is set at the last position in the array, the pointer 30 is reset to point to the first element in the array in step 40. The arrays 50 and 52 in FIG. 5 illustrate how the pointer is reset. After the pointer 30 is reset, the process continues until all of the data points in the array are replaced with new data points. The pointer is subsequently reset again. The process is an endless process and will continue as long as new data points are applied to the median filter. By utilizing the heretofore described process for data handling, it is not necessary to access and move the data in memory, as in conventional systems. Instead, each new data point is written over the oldest data point in the array. By eliminating the data moves, a substantial amount of processing time is saved which allows the system to handle data at a relatively high rate, such as a radio altimeter signal data.

FIG. 6 represents a flow chart for implementing a fast median filter 32 in accordance with the present invention. The median filter 32 is adapted to receive a predetermined number of data points at a time in an array and determine the median of the array. The data points are loaded into the array as discussed earlier. Once the data is input into the median filter 32, two counters are initialized in step 54. One counter, identified as CCOUNT, is set to zero. As the data points in the array are manipulated, the median is determined when the counter CCOUNT returns to zero. However, as a result of certain input data sequences, the counter CCOUNT will not return to zero. This is generally true when monotonic data sequences are processed. Monotonic data sequences are data sequences that contain repeated successive data points. Another counter, CCMIN is utilized to indicate the median for monotonic data sequences. As will be discussed below, in these cases, the element with the smallest count is determined to be the median. The counter CCMIN is initialized in step 42 with a value of 4. This value was selected because of a five-element array being used as an example. If other array sizes are used, then the initial value of the counter CCMIN will have to be adjusted accordingly. After the counters are initialized, the filter continuously compares each data point in the array with each other data point to determine the median. For example, in the first cycle the first data point, $D_1$, is compared individually with the data points $D_2$, $D_3$, $D_4$ and $D_5$. Subsequently in the second cycle the second data point $D_2$ is compared with the data points $D_1$, $D_3$, $D_4$ and $D_5$. This process continues until the last data point in the array $D_5$ has been compared with data points $D_1$, $D_2$, $D_3$ and $D_4$. At the end of each cycle, the value of the counter CCOUNT is examined. If the value of the counter CCOUNT returns to zero at the end of any loop, then the median is determined.

More specifically, after the counters CCOUNT and CCMIN are initialized, a variable Xtemp is set equal to the first data point in the array ain[i], in step 56. The notation ain[i] and ain[j] is used to represent a particular data point in the array and identifies the position of the data point in the array. For example, referring to array 42 in FIG. 5, ain[1]=$D_1$; ain[2]=$D_2$ and so on. To save processing time, the system prevents a data point from being compared with itself in step 58. Thus, a data point will not be compared with itself, e.g., when i=j. In such a case, the system proceeds to the step 66 so that the next sucessive data point in the array is compared with Xtemp in step 60. If the value of the data point ain[j] is greater than the value of Xtemp, the counter CCOUNT is incremented as indicated by step 62. If the value of the data point ain[j] is not greater than the value of Xtemp, the counter CCOUNT is decremented as indicated by step 64. In the next step 66, ain[j] is incremented to the next successive data point in the array, ain[j+1]. Subsequently, in step 68, the system determines if Xtemp has been compared with all of the other data points in the array. If not, the system continues comparing Xtemp with the other data points in the array until Xtemp has been compared with all of the other data points in the array. Meanwhile, the counter CCOUNT is incremented or decremented depending on the results of each comparison. If Xtemp has been compared with all of the other data points in the array, a cycle is completed and the system proceeds to the step 70. In this step 70, the system interrogates the counter CCOUNT to determine if it has a value of zero. If the counter CCOUNT is equal to zero at step 70, Xtemp will correspond to the median and further processing is terminated and the system advances to the end step 82. If the counter CCOUNT is not equal to zero, its contents are compared with the counter CCMIN in step 72. Step 72 and several succeeding steps provide a mechanism for keeping track of the minimum value of the counter CCOUNT in case the median filter is processing data, such as a monotonic data sequence, in which case, the counter CCOUNT may not equal zero at step 70. Specifically, the value of the counter CCOUNT is compared with the value of counter CMIN. If the count of counter CCOUNT is less than the count of counter CCMIN, the counter CCMIN is set to the value of counter CCOUNT in step 74 and a variable Xt1 is set to Xtemp. This step 74 keeps track of the minimum count of the counter CCMIN at the end of each cycle and the data point corresponding to the minimum value of the counter CCOUNT for situations where the median filter is processing monotonic data trends. In such a case, the data point corresponding to the minimum count of the counter CCOUNT will represent the median. Subsequently, in step 76, Xtemp is set to equal the next successive data point in the array. In the step 78, the system determines if each data point in the array has been individually compared with all of the other data points in the array. If so, the processing is completed If not, steps 54-78 are repeated. In step 80, the variable Xtemp is set to the value of the variable Xt1. The variable Xt1 corresponds to the data point corresponding to the minimum count of the counter CCOUNT at the end of any cycle. Xt1 will thus correspond to the median in the last step 82. The process as described will continues long as the array is updated with new data points.

Thus, it should be apparent that a unique fast median filter has been described which is capable of processing signals having a relatively high input data rate, such as radio altimeter signal. The system can be implemented in any number of ways. For example, it may be implemented on a microprocessor and coded in machine or assembly language and/or in high level languages, such as, PASCAL, on machines having PASCAL compilers, without deviating from the principles of the invention. PASCAL is particularly adapted to the system since it is designed to process sequential data.

In Appendix 2, five arbitrary data points were selected to demonstrate the function of the median filter in accordance with the present invention. For each cycle, the values of the counters have been determined manually to illustrate the function of the algorithm. As can be noted for the sequential data points 20, 16, 19, 18, 17, the median is determined after four cycles to be 18, which it is.

Obviously, many modifications and variations of the present invention are possible in light of the above teachings. Thus, it is to be understood that, within the scope of the appended claims, the invention may be practiced otherwise than as specifically described above.

APPENDIX 1
MEDIAN FILTER ALGORITHM

| LABEL | 100, 200; | | |
|---|---|---|---|
| VAR | i, j, ccount, ccmin | : INTEGER; | |
| | xtemp, xtl | : REAL; | |
| BEGIN | | | |
| FOR | := 1 to 5 DO | | |

APPENDIX 1
MEDIAN FILTER ALGORITHM

```
BEGIN
xtemp := ain[i];
ccount := 0; (Initialize ccount and ccmin)
ccmin := 4;
FOR j := 1 to 5 DO
    BEGIN
    IF j = i THEN GOTO 100;      (Don't compare
                                  element with
                                  itself.)
    IF ain[j]    xtemp THEN
                 ccount := ccount + 1
    ELSE         ccount := ccount − 1;
    100: END;
    IF ccount = 0 THEN GOTO 200;  (Median is
                                   located -
                                   jump out of
                                   loop.)
    IF ccount ccmin THEN           (Else, keep
                                   track of
                                   smallest
                                   ccount.)
        BEGIN
        ccmin := ccount;
        xtl := xtemp;
        END;
    END;
xtemp := xtl;     (Exit loop to here if ccount 0. Take
                   xtl, which is value of element of ain
                   which has smallest corresponding value
                   of ccount.)
200:              (jump to here is ccount = 0, − xtemp is
                   median.)
median := xtemp;
END.
```

INPUT DATA MANIPULATION

```
(Main program: Read input data into arin, call filter
and plot results.)
BEGIN
RESET (medfiltin);
REWRITE (medfilout);
(Read input data:0
i := 1;
WHILE NOT EOF (medfiltin) DO
    BEGIN
    READLN (medfiltin, time[i], arin[i, 1], arin
    [i, 2]);
    END
nin := i − 1;
(Load 5-array, and call median filter. Note that
elements of the array are not shifted to accommodate new
data point: an index (iplace) which identifies the
'oldest' element in the array is updated, and allows the
new data point to replace the oldest.)
FOR krun := 1 TO 2 DO
BEGIN
FOR i := 1 TO 5 DO movar[i] := arin [i];   (initial five
                                            points.)
iplace := 1;                               (Initial value
                                            of iplace.)
(Now filter each of the elements of arin in turn:)
FOR ipoint := 6 TO nin DO
    BEGIN
    medfind (movar, median);
    filtout [ipoint, krun] := median;   (put value
                                         in plot
                                         array.)
    movar [iplace] := arin [ipoint,
    krun);       (Replace 'oldest' point
                  with new input.)
    iplace := iplace + 1;
    IF iplace   5 THEN iplace := 1;
    END;
END.
```

| APPENDIX 2 OPERATION OF MEDIAN FILTER | | | | | | |
|---|---|---|---|---|---|---|
| Select data points 20 16 19 18 17 | | | | | | |
| i = 1 | | | i = 2 | | | |
| Xtemp = 20 | | | Xtemp = 16 | | | |
| CCOUNT = 0 | | | CCOUNT = 0 | | | |
| CCMIN = 4 | | | CCMIN = 4 | | | |
| J=1: | * | | J=1: | AIN[20] >16? | Yes | |
| J=2: | AIN[16] >20? | No. | | CCOUNT = 1 | | |
| | CCOUNT = −1 | | J=2: | * | | |
| J+3: | AIN[19] >20? | No. | J=3: | AIN[19] >16? | Yes | |
| | CCOUNT = −2 | | | CCOUNT = 2 | | |
| J=4: | AIN[18] >20? | No. | J=4: | AIN[18] >16? | Yes | |
| | CCOUNT = −3 | | | CCOUNT = 3 | | |
| J=5: | AIN[17] >20? | No. | J=5: | AIN[17] >16? | Yes. | |
| | CCOUNT = −4 | | | CCOUNT = 4 | | |
| i = 3 | | | i = 4 | | | |
| Xtemp = 19 | | | Xtemp = 18 | | | |
| CCOUNT = 0 | | | CCOUNT = 0 | | | |
| CCMIN = 4 | | | CCMIN = 4 | | | |
| J=1: | AIN[20] >19? | Yes | J=1: | AIN[20] >18? | Yes | |
| | CCOUNT = 1 | | | CCOUNT = 1 | | |
| J=2: | AIN[16] >19? | No. | J=2: | AIN[16] >18? | No. | |
| | CCOUNT = −0 | | | CCOUNT = 0 | | |
| J+3: | * | | J=3: | AIN[19] >18? | Yes | |
| | | | | CCOUNT = 1 | | |
| J=4: | AIN[18] >19? | No. | J=4: | * | | |
| | CCOUNT = −1 | | J=5: | AIN[17] >18? | No | |
| J=5: | AIN[17] >19? | No. | | CCOUNT = 0 | | |
| | CCOUNT = −2 | | | | | |

*Number is not compared with itself.
** Median is located, exit loop

What is claimed and desired to be secured by Letters Patent of the United States is:

1. A median filter for continuously determining the median of a time varying signal and providing a time varying signal representative of the media, comprising:
means for continuously received data points representative of said time varying signal;
means including an array having N data positions coupled to said receiving means for serially storing N data points, said storing means including means for identifying the oldest one of the stored data points;
means including a counter coupled to said storing means for successively comparing each one of said N stored data points with each of the other N−1 stored data points and either incrementing or decrementing a counter depending upon whether said one data point is greater than or less than the data point with which it is being compared, wherein said counter is neither incremented nor decremented if the data points being compared are equal, said comparing means including means for initializing said counter prior to comparing each successively compared data point with said other data points;
means responsive to a count in said counter resulting from said incrementation and decrementation thereof for providing an indication that the current one of said N data points being compared with the others is the median when the count indicator indicates that the counter has been incremented and decremented an equal number of times;
means operative when there is no count indicative that the counter has been incremented and decremented an equal number of times responsive to counts produced by each one of said data points for selecting the data point corresponding to a count representative of a smallest difference in the number of times the counter has been incremented as the median; and
means for providing an electrical signal representative of said media.

2. A median filter as recited in claim 1 further including means responsive to said count for terminating the operation of said comparing means when a count indicating that the counter has been incremented and decremented an equal number of times is detected.

3. A media filter as recited in claim 1, wherein said receiving means and said storing means cooperate to replace the oldest one of said stored N data points as indicated by said oldest data point identifying means with a newly received data point.

4. A median filter as recited in claim 3 wherein said median filter is responsive to the receipt and storage of each newly received data point for computing the median of the currently stored data points.

5. A median filter for continuously determining the median of a time varying signal and providing a time varying signal representative of the median, comprising:
means for continuously receiving data points representative of said time varying signal;
means including an array having N data positions coupled to said receiving means for serially storing N data points, said storing means including means for identifying the data position containing the oldest one of the stored data points;
means coupled to said storing means for comparing each of said N stored data points with each of the other N−1 stored data points and providing a first indication if the one of said N stored data points being compared is greater than one of the other N−1 stored data points and a second indication if one of said N stored data points being compared is not greater than one of said other stored N−1 data points, wherein said comparing means includes a counter responsive to said first and second indications for determining a difference in number of said first and second indications and for identifying as the median a data point that results in a smallest difference in number of first and second indications; and means coupled to said receiving means and responsive to said identifying means for replacing the oldest stored data point located in the data position identified by said identifying means with a subsequently received N+1 data point from said receiving means and recalculating the median.

* * * * *